(12) United States Patent
Shih et al.

(10) Patent No.: US 8,215,321 B2
(45) Date of Patent: Jul. 10, 2012

(54) METHODS AND APPARATUS FOR WET CLEANING ELECTRODE ASSEMBLIES FOR PLASMA PROCESSING APPARATUSES

(75) Inventors: Hong Shih, Walnut, CA (US); Yaobo Yin, Pleasanton, CA (US); Jason Augustino, Fremont, CA (US); Catherine Zhou, Oakland, CA (US); Armen Avoyan, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/081,210

(22) Filed: Apr. 6, 2011

(65) Prior Publication Data

US 2011/0180117 A1 Jul. 28, 2011

Related U.S. Application Data

(62) Division of application No. 11/640,975, filed on Dec. 19, 2006, now Pat. No. 7,942,973.

(60) Provisional application No. 60/851,747, filed on Oct. 16, 2006.

(51) Int. Cl.
*B08B 3/00* (2006.01)
(52) U.S. Cl. ............... 134/94.1; 15/3; 134/198
(58) Field of Classification Search .................. None
See application file for complete search history.

(56) References Cited

U.S. PATENT DOCUMENTS

| 6,787,111 B2 | 9/2004 | Roach et al. |
| 7,621,281 B2 | 11/2009 | Ikemoto et al. |
| 7,942,973 B2 | 5/2011 | Shih et al. |
| 2003/0098040 A1* | 5/2003 | Nam et al. ................. 134/1.3 |
| 2003/0190870 A1 | 10/2003 | Shih et al. |

FOREIGN PATENT DOCUMENTS

| JP | 07-066180 | 3/1995 |
| JP | 2006-179550 | 7/2006 |
| KR | 2003-0012828 A1 | 2/2003 |

OTHER PUBLICATIONS

International Search Report and Written Opinion mailed Apr. 2, 2008 for PCT/US2007/021628.
Official Action mailed May 11, 2010 for Chinese Appln. No. 200780038553.4.

* cited by examiner

*Primary Examiner* — Michael Kornakov
*Assistant Examiner* — Eric Golightly
(74) *Attorney, Agent, or Firm* — Buananan Ingersoll & Rooney PC

(57) ABSTRACT

Methods of cleaning backing plates of electrode assemblies, or electrode assemblies including a backing plate and an electrode plate are provided. The methods can be used to clean backing plates and electrode plates made of various materials, such as silicon electrode plates and graphite and aluminum backing plates. The backing plates and electrode assemblies can be new, used or refurbished. A flushing fixture that can be used in the cleaning methods is also provided, the flushing fixture comprising a base plate comprising a recessed inner portion including and an upper surface configured to support the backing plate or the electrode assembly, and a cover plate configured to cover the base plate, the cover plate including at least one liquid passage through which a flushing liquid is introduced into an interior of the flushing fixture defined by the base plate and cover plate.

18 Claims, 6 Drawing Sheets

METHODS AND APPARATUS FOR WET CLEANING ELECTRODE ASSEMBLIES FOR PLASMA PROCESSING APPARATUSES

This application is a divisional application of U.S. application Ser. No. 11/640,975 entitled "METHODS AND APPARATUS FOR WET CLEANING ELECTRODE ASSEMBLIES FOR PLASMA PROCESSING APPARATUSES", filed on Dec. 19, 2006, and issued as U.S. Pat. No. 7,942,973, which claims priority under 35 U.S.C. §119(e) to U.S. Provisional Application No. 60/851,747 entitled "METHODS AND APPARATUS FOR WET CLEANING ELECTRODE ASSEMBLIES FOR PLASMA PROCESSING APPARATUSES" filed on Oct. 16, 2006, the entire content of each is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and bottom electrodes. An electric field is established between the electrodes to excite a process gas into the plasma state to process substrates in the reaction chamber.

SUMMARY

An exemplary embodiment of a method for cleaning a backing plate of an electrode assembly for a plasma processing apparatus is provided, which comprises contacting the backing plate with a solvent and wiping the outer surface of the backing plate to remove particles from the outer surface; spraying the backing plate with water to remove particles from outer surface of the backing plate and particles contained in gas passages of the backing plate; ultrasonically cleaning the backing plate; and flushing the backing plate with a flushing liquid in a flushing fixture that encloses the backing plate to remove particles from the outer surface of the backing plate and particles contained in the gas passages of the backing plate.

An exemplary embodiment of a method for cleaning an electrode assembly comprising a backing plate bonded to an electrode plate for a plasma processing assembly is provided, which comprises contacting the backing plate and electrode plate with a solvent and wiping the outer surface of the backing plate and the outer surface of the electrode plate to remove particles from the outer surfaces of the backing plate and electrode plate; spraying the backing plate and electrode plate with water to remove particles from the outer surfaces of the backing plate and electrode plate, and particles contained in gas passages of the backing plate and electrode plate; ultrasonically cleaning the electrode assembly; and flushing the electrode assembly with a flushing liquid in a flushing fixture that encloses the electrode assembly to remove particles from the outer surfaces of the backing plate and electrode plate and particles contained in the gas passages of the backing plate and electrode plate.

An exemplary embodiment of a flushing fixture adapted for cleaning a backing plate, or an electrode assembly including the backing plate and an electrode plate, for a plasma processing chamber, comprises a base plate comprising a recessed inner portion including an upper surface, an outer portion, a lower surface, a plurality of liquid passages extending between the upper surface and the lower surface, the upper surface configured to support the backing plate or the electrode assembly; and a cover plate configured to cover the base plate when the backing plate or electrode assembly is supported on the upper surface of the base plate, the cover plate including at least one liquid passage through which a flushing liquid is introduced into an interior of the flushing fixture defined by the base plate and cover plate, the flushing liquid passes through gas passages in the backing plate, or through gas passages in the backing plate and electrode plate of the electrode assembly, and exits the flushing fixture through the liquid passages in the base plate.

DRAWINGS

DETAILED DESCRIPTION

Figure 1:
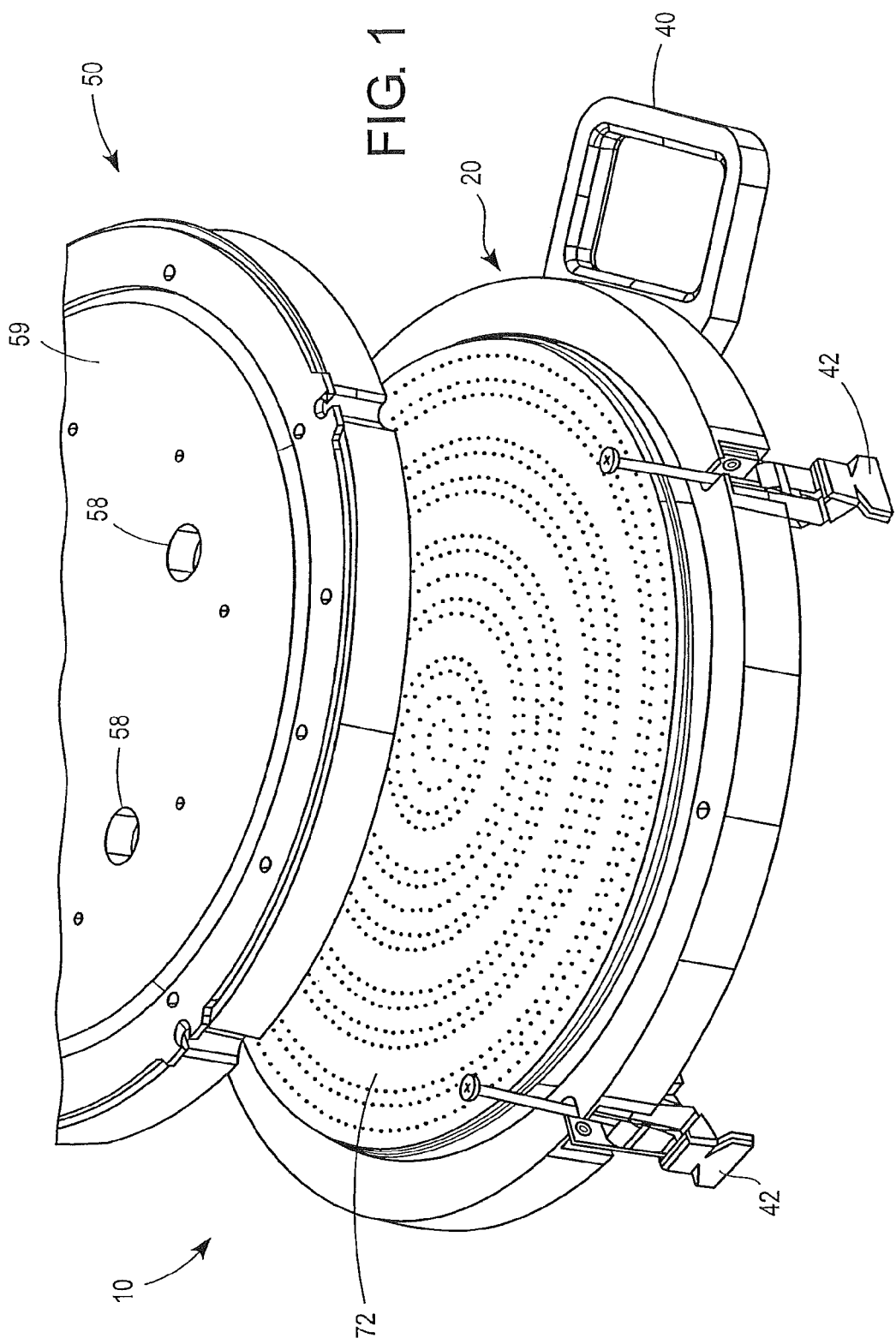
FIG. 1 shows an exemplary embodiment of a flushing fixture including a cover plate removed from a base plate.

Methods of cleaning backing plates and electrode assemblies for plasma processing apparatuses are provided. The backing plates and electrode assemblies can be new, used or reconditioned. Apparatuses for cleaning the backing plates and electrode assemblies are also provided.

During the plasma processing of semiconductor substrates, it is desirable to minimize the number of particles introduced into the plasma processing chamber by chamber components. Such particles, referred to as "adders," can deposit on the substrates and consequently reduce process yields.

Plasma processing chambers can include an upper electrode assembly and a substrate support facing the upper electrode assembly and having a lower electrode. The upper electrode can be a showerhead electrode assembly, for example. Showerhead electrode assemblies can be a source of particles. Such assemblies can include an electrode plate and a backing member, such as a backing plate, secured to the electrode plate. The electrode plate and backing plate can have gas passages through which process gas is introduced into the plasma processing chamber. The backing plate can be made of graphite, for example. Graphite is relatively soft and brittle. The electrode plate can be made of silicon, for example. The electrode plate can be bonded to the backing plate.

The electrode plate and/or the backing plate can be a source of particles. The particles can originate from different sources during the manufacturing of the electrode assemblies. For example, the particles can result from manufacturing of the graphite backing plate, pre-bonding contamination of the electrode plate and/or backing plate, the bonding process, handling and insufficient cleaning, and packaging. The particles can be inorganic (e.g., graphite or metals) or organic substances.

Control of particulate contamination on the surfaces of semiconductor wafers during the fabrication of integrated circuits is essential in achieving reliable devices and obtaining a high yield. The presence of particles on a wafer surface can locally disrupt pattern transfer during photolithography and etching steps. As a result, these particles can introduce defects into critical features, including gate structures, inter-metal dielectric layers or metallic interconnect lines, and cause the malfunction or failure of integrated circuit components.

Enhanced cleaning methods are provided that can significantly reduce the number of particles on upper electrode assemblies, such as showerhead electrode assemblies. Embodiments of the methods can be used to clean only the backing plate of an electrode assembly. Other embodiments can be used to clean the electrode assembly including an electrode plate secured to a backing plate.

Embodiments of the methods can be used to clean new, used or refurbished backing plates and electrode assemblies. As described herein, "new" backing plates and electrode assemblies have not been used in a plasma processing chamber for processing semiconductor substrates; "used" backing plates and electrode assemblies have been used in a plasma processing chamber for processing semiconductor substrates; and "refurbished" backing plates and electrode assemblies have been used in a plasma processing chamber for processing semiconductor substrates, and the electrode plate has subsequently been treated, e.g., polished, to remove undesirable surface contamination and/or surface structure, e.g., black silicon, or uneven surface regions, formed on the bottom (plasma-exposed) surface of the silicon electrode plate during plasma processing. The entire bottom surface of the electrode plate, or only a portion of the bottom surface can be polished, depending on its condition. Silicon electrode plates may be refurbished one or more times.

The electrode plate of the electrode assembly can be composed, for example, of silicon (preferably single-crystal silicon) or silicon carbide. The electrode plate is typically circular, and can have a diameter of 200 mm, 300 mm, or even larger, for example. The electrode plate can have any suitable thickness, such as from about 0.25 in to about 0.5 in. The backing plate can be composed, for example, of graphite or aluminum. The backing plate is typically circular and sized to correspond with the shape and size of the electrode plate. The electrode assembly can include an outer electrode, such as an outer ring, surrounding the electrode plate, and an outer backing member, such as an outer backing ring, surrounding the backing plate.

Exemplary embodiments of the enhanced cleaning methods can include at least the following four steps. For cleaning the backing plate only of an electrode assembly, the backing plate is cleaned with a suitable cleaning liquid containing a solvent, such as isopropyl alcohol. The backing plate can be immersed in the cleaning liquid. The backing plate is also wiped with a clean room cloth. The solvent can remove organic materials from the backing plate resulting from manufacturing and/or processing.

After the wiping, the backing plate is then sprayed with water. The water used in embodiments of the cleaning methods is preferably high-purity deionized water. The spraying is conducted at a selected water pressure and for an effective amount of time. New parts typically can be sprayed for a shorter period of time than used or refurbished parts to achieve the desired cleaning. New, used and refurbished parts typically are sprayed more than once.

After the spraying, the backing plate is ultrasonically cleaned in a liquid bath. The ultrasonic cleaning is conducted at a selected power level, temperature and for an effective amount of time to remove particles from the backing plate. The liquid is preferably high-purity, deionzed water. This step can be performed more than once. New parts typically can be ultrasonically cleaned for a shorter period of time than used or refurbished parts to achieve the desired result. Used and refurbished parts typically are ultrasonically cleaned more than once.

The backing plate is also cleaned in a flushing fixture described in greater detail below. The flushing fixture utilizes a flushing liquid at an elevated pressure to remove particles from within gas passages of the backing plate (and/or electrode plate of an electrode assembly).

For an electrode assembly including a backing plate secured to an electrode plate, the cleaning with a solvent and with deionized water, and the spraying with pressurized deionized water, are preformed on the exposed surfaces of the electrode plate and backing plate.

Additional aspects of the enhanced cleaning methods will be described with reference to the cleaning of an exemplary embodiment of an electrode assembly including a silicon electrode plate and a graphite or metal (e.g., aluminum) backing plate adhesively bonded to the electrode plate. As described above, however, embodiments of the cleaning methods can be used to clean backing plates prior to bonding them to electrode plates, e.g., graphite backing plates or aluminum backing plates. For example, the methods can be used to clean a graphite backing plate before it is bonded to a silicon electrode, and then to again clean the electrode assembly after the graphite backing plate has been bonded to the silicon electrode. The cleaning removes surface particles as well as particles contained in gas passages of the backing plate and electrode plate, and particles between the plates. The electrode assembly can be new, used or refurbished.

Initially, the electrode assembly is visually inspected for defects.

The electrode assembly is treated with a solvent, preferably by immersion in a solvent tank containing isopropyl alcohol or the like. The electrode assembly is treated (e.g., immersed) for a desired amount of time, e.g., about 5 minutes to about 15 minutes. The silicon electrode plate and graphite plate are both wiped with a clean room cloth to remove surface contaminants including organics and human contamination.

Preferably in a Class 10 clean room, the silicon electrode plate is sprayed with a spray gun using deionized water at a selected pressure, typically of less than about 50 psi pressure, using $N_2$ or the like. Typically, the silicon electrode plate is sprayed for at least about 3-5 minutes, the graphite plate is sprayed for at least about 2-5 minutes, and the silicon electrode plate is again sprayed for at least about 3-5 minutes, for a total of at least about 10 minutes. The spraying is effective to remove surface particles from the silicon electrode plate and backing plate, and also to remove particles contained inside of the gas passages of these plates.

Preferably in a Class 10 clean room, the silicon electrode plate is wiped with isopropyl alcohol/deionized water until no contamination is visible on the wipe. The graphite backing plate is also wiped with isopropyl alcohol/deionized water until no contamination is visible on the wipe Wiping removes surface particles on the plates.

Preferably in a Class 10000 clean room, the electrode assembly is immersed in an ultrasonic tank containing deionized water at a temperature of about 40-50° C. for about 5 to about 20 minutes Ultrasonic cleaning removes particles from the electrode assembly.

Preferably in a Class 10000 clean room, the electrode plate is again sprayed with a spray gun as described above using deionized water at a selected pressure, typically of less than about 50 psi. Typically, the silicon electrode plate is sprayed for at least about 3-5 minutes, the graphite plate is sprayed for at least about 2-5 minutes, and the silicon electrode plate is again sprayed for at least about 3-5 minutes, for a total of at least about 10 minutes. The spraying is effective to remove surface particles from the silicon electrode plate and backing plate, and also to remove particles contained inside of the gas passages of these plates.

Figure 2:
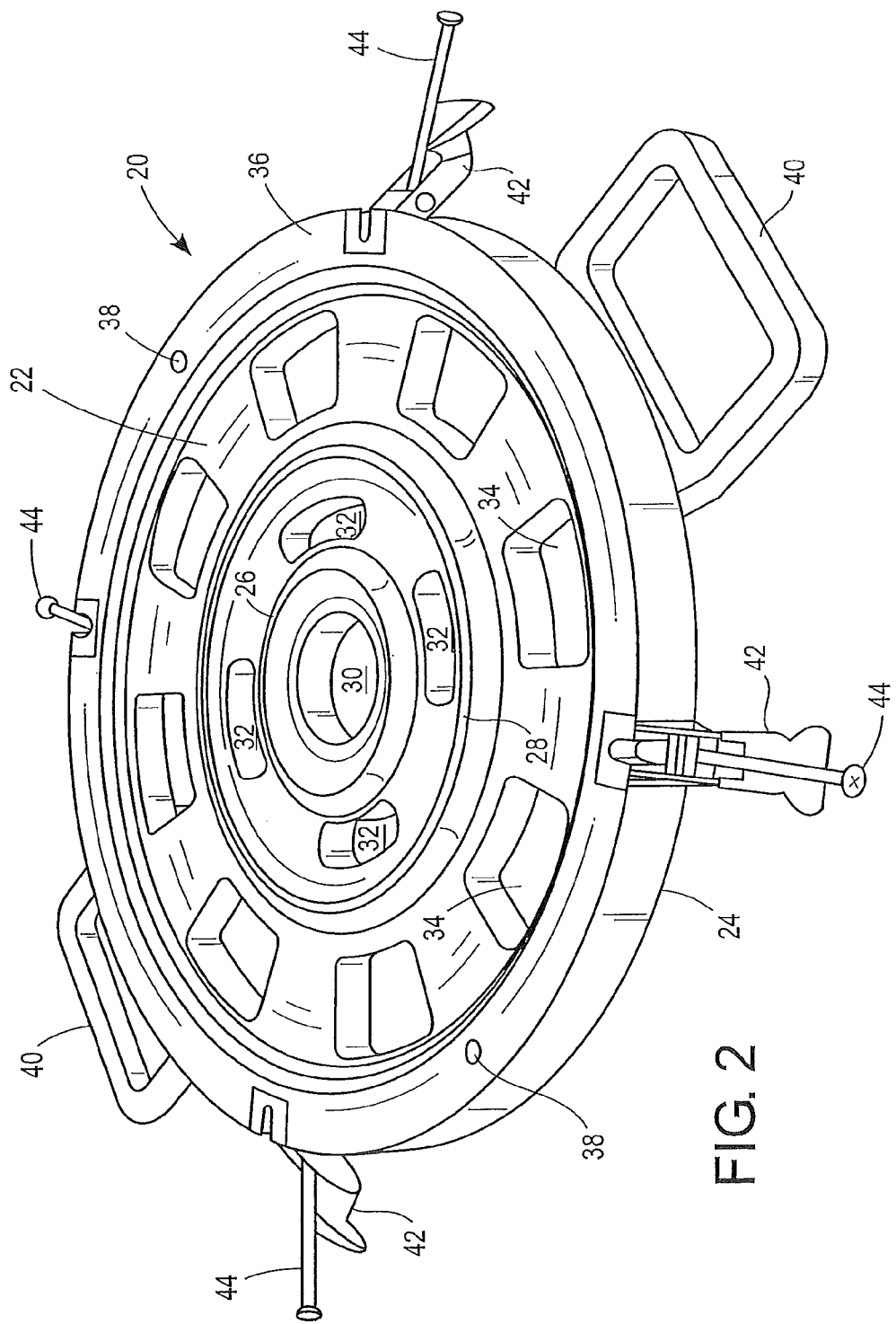
FIG. 2 shows a top perspective view of the base plate of the flushing fixture shown in FIG. 1.
Figure 3:
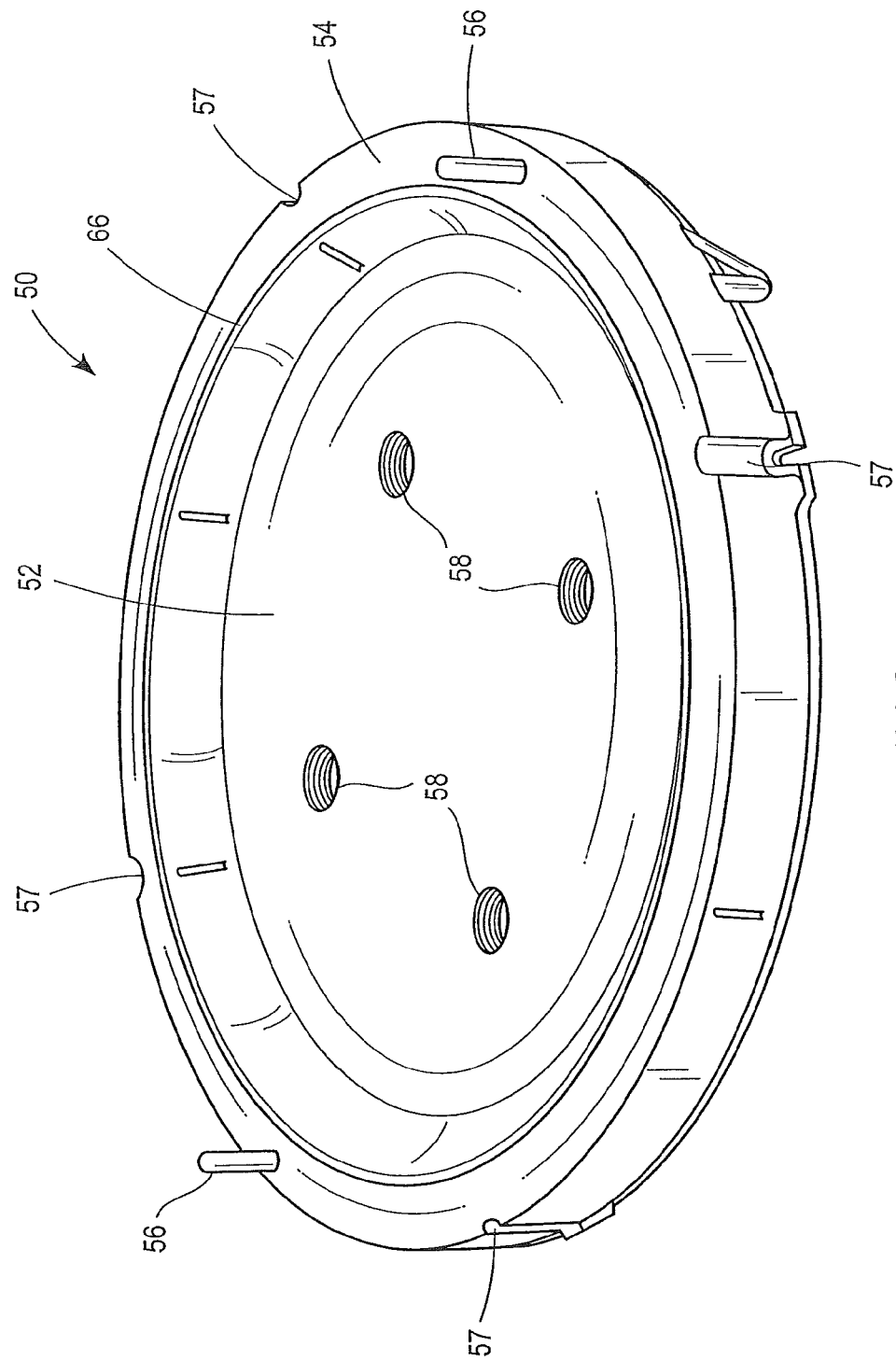
FIG. 3 shows a bottom perspective view of the cover plate of the flushing fixture shown in FIG. 1.

Preferably in a Class 10 clean room, the electrode assembly is installed in a flushing fixture. An exemplary embodiment of the flushing fixture 10 constructed to clean an electrode assembly (or a backing plate of an electrode assembly) is shown in FIGS. 1 to 3. The flushing fixture 10 comprises a base plate 20 and a cover plate 50. FIG. 1 depicts the flushing fixture 10 with the cover plate 50 removed. The illustrated base plate 20 has a circular configuration and comprises an upper surface 22 and a lower surface 24. The upper surface 22 includes an annular first projection 26 and an annular second projection 28 located radially outward from the first projection 26. The upper surface 22 includes a central liquid passage 30, a plurality of circularly-spaced liquid passages 32 located between the first projection 26 and the second projection 28, and a plurality of circularly-spaced liquid passages 34 located between the second projection 28 and an outer portion 36 of the base plate 20, which surrounds the inner portion. Diametrically-opposed alignment holes 38 are formed in the outer portion 36. In FIG. 1, the electrode assembly including the electrode plate 72 and an underlying backing plate 74 (FIG. 5) secured to the electrode plate 72 is supported on the base plate 20.

In the embodiment, the base plate 20 includes handles 40 provided on the outer portion 36 to allow a user to transport the flushing fixture 10. For example, a user can grasp the handles 40 to position the flushing fixture 10 at the open upper end of a tank used with the flushing fixture 10 for cleaning operations. During use of the flushing fixture 10, a flushing liquid, e.g., high-purity, deionized water, is flowed through the fluid passages 30, 32, 34 of the base plate 20 and into the tank.

In the embodiment, circularly-spaced latches 42 are provided on the outer portion 36 of the base plate 20. Each of the latches 42 includes a fastener 44. As shown in FIG. 2, the latches 42 are preferably recessed so that the latches 42 do not come into contact with an electrode assembly supported on the base plate 20.

The cover plate 50 of the flushing fixture 10 shown in FIG. 3 is configured to cover the base plate 20. The cover plate 50 comprises a recessed inner portion 52 sized to overly the inner portion of the base plate 20, and an outer portion 54 adapted to overly the outer portion 36 of the base plate 20, when the cover plate 50 is installed on the base plate 20. The cover plate 50 includes alignment pins 56, each of which is sized to be inserted into a respective alignment hole 38 in the outer portion 36 of the base plate 20 when the cover plate 50 is placed on the base plate 20. The alignment pins 56 are preferably made of a soft, flexible material, such as polytetrafluoroethylene (PTFE), or the like, to avoid damage to the electrode assembly. The cover plate 50 also comprises a plurality of cut-outs 57 formed in the outer portion 54, each being configured to receive a fastener 44 of a latch 42 to secure the cover plate 50 to the base plate 20.

The inner portion 52 of the cover plate 50 includes at least one liquid passage, preferably multiple liquid passages 58, through which a flushing liquid is introduced into the space between the inner portion 52 of the cover plate 50 and the inner portion of the base plate 20. In an embodiment, each of the liquid passage 58 can be connected in fluid communication with a separate liquid supply line.

Figure 4:
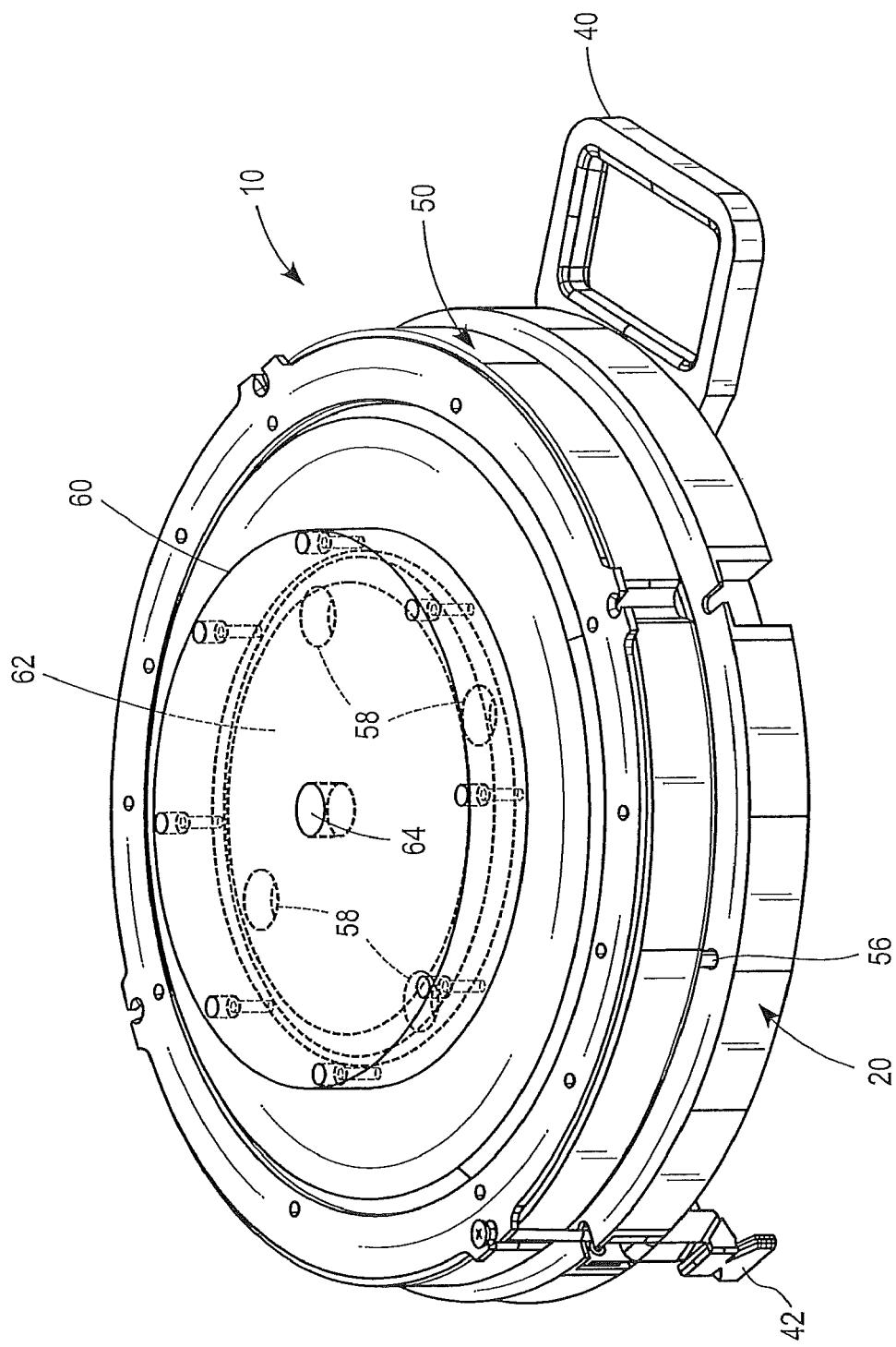
FIG. 4 shows another exemplary embodiment of a flushing fixture including a cover plate secured to a base plate.

As shown in FIG. 4, the flushing fixture 10 includes an enclosure 60 defining a plenum 62 provided on the top surface 59 of the cover plate 50. The enclosure 60 includes a single fluid passage 64 for connection to a liquid supply line to supply a flushing liquid to each of the liquid passages 58.

Figure 5:
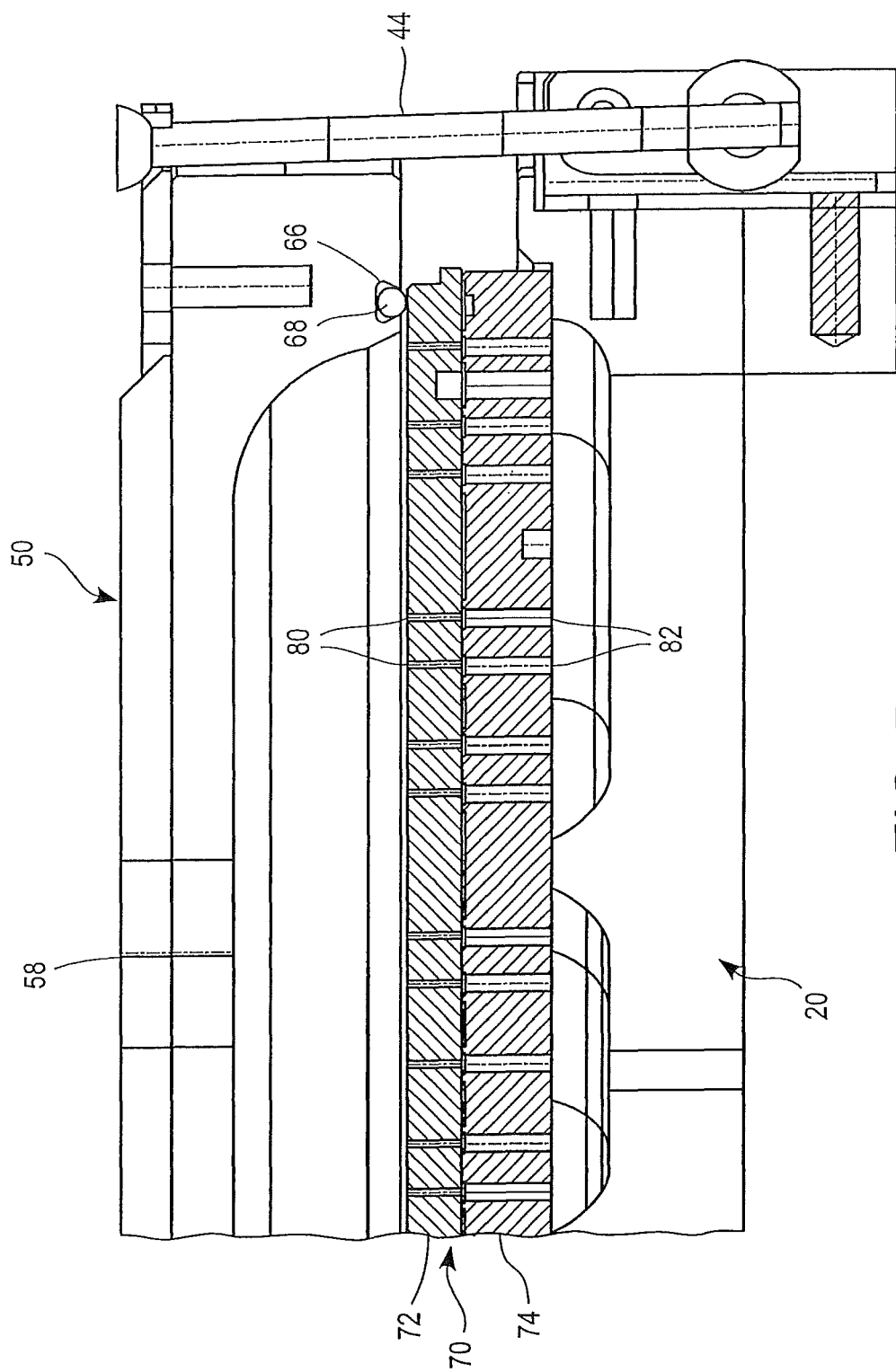
FIG. 5 is a cross-sectional view of a portion of the flushing fixture shown in FIG. 1 in an assembled condition with an electrode assembly including an electrode plate and a backing plate positioned inside of the flushing fixture.
Figure 6:
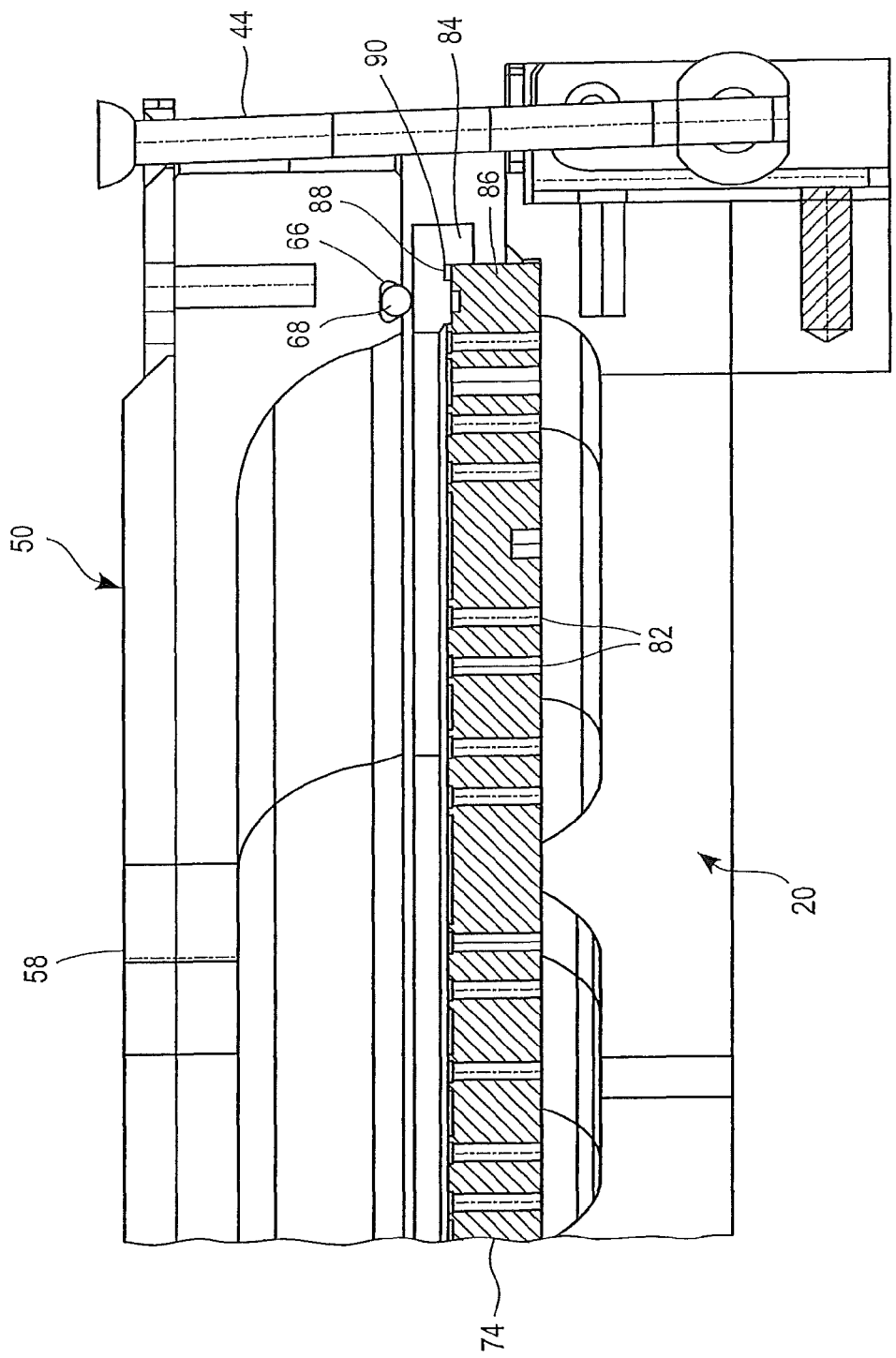
FIG. 6 is a cross-sectional view of a portion of the flushing fixture shown in FIG. 1 in an assembled condition with a backing plate of an electrode assembly positioned inside of the flushing fixture.

The outer portion 54 of the cover plate 50 includes a circular groove 66 (FIG. 3) and an O-ring 68 inserted in the groove 66 (FIGS. 5 and 6). As described below, the O-ring 68 provides a water-tight seal between the cover plate 50 and a portion of an electrode assembly that is supported on the base plate 20 when the cover plate 50 is secured to the base plate 20.

The base plate 20 and cover plate 50 are made from a suitable material that is compatible with the materials of electrode assemblies. In a preferred embodiment, the base plate 20 and cover plate 50 are made of a polymeric material, such as polyetherimide. Regarding the base plate 20, the latches 42 can be made of other suitable materials.

FIG. 5 depicts the flushing fixture 10 with the cover plate 50 secured to the base plate 20. The electrode assembly 70 including the electrode plate 72 and the backing plate 74 is supported on the base plate 20 and enclosed in the flushing fixture 10. The electrode plate 72 is bonded (e.g., adhesively bonded) to the backing plate 74. As discussed above, the electrode assembly can be new, used or refurbished. The electrode plate 72 can be composed, e.g., of silicon or SiC. The backing plate 74 can be composed, e.g., of graphite or aluminum. The electrode of the electrode assembly 70 can include an outer electrode, e.g., a continuous or multi-segment ring, configured to surround the electrode ring 72. The backing member can also include a ring configured to surround the backing plate 74. The rings of the electrode and backing member can be cleaned without using the flushing fixture 10 because the rings typically include only a small number of holes or no holes. That is, the rings of the electrode and backing member can be cleaned using each of the steps of the cleaning methods other than using the flushing fixture.

As shown in FIG. 5, the O-ring 68 provided in the groove 66 in the cover plate 50 contacts a surface 76 of the electrode plate 72 (i.e., a surface that is exposed to plasma when the electrode assembly 70 is installed in a plasma processing chamber) at an outer peripheral portion 78 of the electrode plate 72 and forms a liquid-tight seal between the electrode plate 72 and the outer portion 54 of the cover plate 50. The electrode plate 72 includes gas passages 80 in fluid communication with larger gas passages 82 in the backing plate 74.

To clean the electrode assembly 70, the flushing liquid is introduced at high pressure into the flushing fixture 10 through the liquid passages 58 in the cover plate 50 and flows through the gas passages 80 in the electrode plate 72 and then through the gas passages 82 in the underlying backing plate 74. Typically, the flushing liquid is deionized water. The flushing liquid can contain a solvent, such as isopropyl alcohol. The flushing liquid is typically introduced at a pressure of about 40-50 psi and a flow rate of about 5-10 gallons/min. The flushing liquid can be at ambient temperature or at an elevated temperature, such as about 40-50° C. The flushing fluid preferably is not recirculated. Preferably, particle filters (e.g., 0.2 and 1 μm) are provided along the liquid lines to remove particles from the flushing liquid.

Particles contained in the gas passages 80 of the electrode plate 72 and/or backing plate 74, and particles trapped between the electrode plate 72 and backing plate 74 during handling and bonding, are entrained in the flushing liquid and removed from the gas passages 80, 82 and from between the electrode plate 72 and backing plate 74. The flushing liquid then flows out of the flushing fixture 10 via the liquid passages 30, 32, 34 in the inner portion of the base plate 20. As shown, the electrode assembly 70 is placed on the base plate 20 with the electrode plate 72 facing the cover plate 50 to allow particles removed from the gas passages 80 of the electrode plate 72 to pass through the larger gas passages 82 of the base plate 20. If the electrode assembly 70 is instead placed on the base plate 20 with the backing plate 74 facing the cover plate 50, large particles removed from the gas passages 82 of the backing plate 74 can be trapped in the smaller gas passages 80 of the electrode plate 72 and, consequently, may not be removed from the electrode plate 72.

FIG. 6 depicts another embodiment of the flushing fixture 10 with the cover plate 50 secured to the base plate 20 and only the backing plate 74 of the electrode assembly 70 supported on the base plate 20. In this embodiment, an adapter ring 84 is provided to overly a surface of the backing plate 74 and protect the surface. The adapter ring 84 includes a groove 88 sized to receive a raised peripheral edge 90 of the outer peripheral portion 86 of the backing plate 74 to protect the peripheral edge 90 from damage. The O-ring 68 provided on the cover plate 50 contacts the surface of the adapter ring 84 and forms a liquid-tight seal between the cover plate 50 and the adapter ring 84.

To clean the backing plate 74 shown in FIG. 6, the flushing liquid is introduced under pressure into the flushing fixture 10 through the liquid passages 58 in the cover plate 50 and flowed through the gas passages 82 in the backing plate. Particles contained in the gas passages 82 of the backing plate 74 are entrained in the flushing liquid.

The backing plate or electrode assembly can be cleaned once or several times in the flushing fixture 10 depending on the condition of the backing plate or electrode assembly. For example, the backing plate or electrode assembly can cleaned using isopropyl alcohol flushing (e.g., 2% isopropyl flushing), hot deionized water flushing, and final deionized water flushing.

After the electrode assembly is cleaned in the flushing fixture, the silicon electrode plate is wiped with isopropyl alcohol/deionized water until no contamination is visible on the wipe. The graphite backing plate is wiped with isopropyl alcohol/deionized water until no contamination is visible on the wipe. The silicon electrode plate can be wiped again with isopropyl alcohol/deionized water until no contamination is visible on the wipe. The wiping removes particles from the surfaces of the electrode plate and backing plate.

Preferably in a Class 10 clean room, the electrode assembly is again immersed in an ultrasonic tank containing deionized water at a temperature of about 40-50° C. for about 5 to about 20 minutes to remove particles.

Preferably in a Class 10 clean room, the surface of the silicon electrode plate is cleaned with a mixed acid by wiping to remove surface contamination on the silicon electrode to reduce the number of surface particles. A suitable mixed acid for silicon electrodes contains a mixture of $HF/HNO_3/HAc$. The acid wiping can be performed for about 2-5 minutes, for example. The acid wiping removes metal contamination from the silicon surface. The silicon electrode plate is rinsed with deionized water between acid wiping.

After the acid wiping, there is preferably no direct human contact of the surface of the silicon electrode plate, and all contact is with gloves or equipment.

Preferably in a Class 10 clean room, the electrode assembly is again sprayed with a spray gun using deionized water at a selected pressure, typically of less than about 50 psi. The silicon electrode plate is typically sprayed for at least about 3-5 minutes, the graphite backing plate is sprayed for at least about 2-5 minutes, and the silicon electrode plate is again sprayed for at least about 3-5 minutes, for a total of at least about 10 minutes. The spraying is effective to remove surface particles from the silicon electrode plate and the graphite backing plate, and also to remove particles contained inside of the gas passages of these plates.

Preferably in a Class 10 clean room, the silicon electrode plate is dried with nitrogen.

Next, preferably in a Class 10 clean room, the electrode assembly is heated at a temperature of about 110-120° C. for a period of about 3-5 hours to completely remove water from the electrode assembly.

Preferably in a Class 10 clean room, the electrode assembly is visually inspected for physical defects and cosmetic defects.

The electrode assembly is then subjected to surface particle count analysis.

The electrode assembly is then packaged. Preferably in a Class 10 clean room, the electrode assembly is placed into a nylon inner bag. Preferably in a Class 1000 clean room, the inner bag is sealed. The inner bag is placed inside of an outer bag, which is vacuum sealed.

EXAMPLES

Example 1

The number of particles on an as-received graphite backing plate that had not been subjected to ultrasonic cleaning was measured using a liquid particle counter. The graphite backing plate was then ultrasonically cleaned in a tank for 1 hr, 2 hr and 3 hr in deionized water at a temperature of about 50° C., an ultrasonic frequency of 40 kHz and a power density after graphite loading of 10-20 $W/in^2$. That is, the graphite plate was ultrasonically cleaned for 1 hr, then removed from the liquid bath and tested, then subjected to ultrasonic cleaning for 1 additional hour, then removed from the liquid bath again and tested, then subjected to ultrasonic cleaning for 1 additional hour (for a total of 3 hr), then removed from the liquid bath again and tested. The number of particles on the backing plate was then measured for each cleaning time period using the liquid particle counter, which analyzes the liquid in which the graphite backing plate is cleaned. The measurement results are shown in Table 1.

TABLE 1

| | Concentration of Particles/$cm^2$ | | | |
|---|---|---|---|---|
| Particle Size | As-Received | Post 1 hr Ultrasonic Cleaning | Post 2 hr Ultrasonic Cleaning | Post 3 hr Ultrasonic Cleaning |
| ≧0.2 μm | 330,000,000 | 17,000,000 | 9,700,000 | 6,900,000 |
| ≧0.3 μm | 150,000,000 | 7,300,000 | 3,700,000 | 2,600,000 |
| ≧0.5 μm | 25,000,000 | 1,200,000 | 4,900,000 | 340,000 |
| ≧1.0 μm | 1,700,000 | 90,000 | 38,000 | 27,000 |
| ≧2.0 μm | 77,000 | 2,300 | 2,700 | 2,400 |

As shown in Table 1, the ultrasonic cleaning significantly reduced the number of particles for each size category on the graphite backing plate. However, the number of particles of a size of at least 0.2 μm was still 6,900,000 after the 3 hr ultrasonic cleaning.

Example 2

The number of particles on an as-received graphite backing plate that had been subjected to ultrasonic cleaning was measured using a liquid particle counter. The graphite backing plate was then ultrasonically cleaned as described in Example 1. The number of particles on the backing plate was then measured for each cleaning time period using the liquid particle counter. The measurement results are shown in Table 2.

TABLE 2

| | Concentration of Particles/cm² | | | |
|---|---|---|---|---|
| Particle Size | As-Received (with ultrasonic cleaning) | Post 1 hr Ultrasonic Cleaning | Post 2 hr Ultrasonic Cleaning | Post 3 hr Ultrasonic Cleaning |
| ≧0.2 μm | 23,000,000 | 12,000,000 | 3,700,000 | 2,100,000 |
| ≧0.3 μm | 11,000,000 | 4,400,000 | 1,500,000 | 780,000 |
| ≧0.5 μm | 1,700,000 | 510,000 | 220,000 | 91,000 |
| ≧1.0 μm | 100,000 | 37,000 | 16,000 | 6,700 |
| ≧2.0 μm | 2,800 | 2,400 | 500 | 630 |

As shown in Table 2, the ultrasonic cleaning reduced the number of particles for each size category on the as-received graphite backing plate. The post 1 hr, 2 hr and 3 hr ultrasonic cleaning of the graphite backing plate further reduced the number of particles. However, the number of particles of a size of at least 0.2 μm was still 2,100,000 after the 3 hr ultrasonic cleaning.

Example 3

The number of particles on the surface of an as-received graphite backing plate that had not been subjected to ultrasonic cleaning was measured using a surface particle counter. Particle count measurements outside of a clean room for particles of a size of at least 0.3 μm were as follows: 12,468 counts/in², 13,646 counts/in² and 9,298 counts/in², for an average value of 11,804 counts/in².

Example 4

The number of particles on the surface of an as-received graphite backing plate that had been subjected to ultrasonic cleaning was measured using a surface particle counter. Particle count measurements outside of a clean room for particles of a size of at least 0.3 μm were as follows: 4,794 counts/in², 4,213 counts/in² and 4,274 counts/in², for an average value of 4,427 counts/in².

Example 5

In this example, the as-received graphite backing plate of Example 3 that had not been subjected to ultrasonic cleaning was cleaned according to an exemplary embodiment of the enhanced cleaning methods. The graphite cleaning method included the following procedures. The graphite backing plate was inspected and surface particles counts were taken for the graphite backing plate using a laser particle counter at multiple locations outside of a clean room. The graphite backing plate was immersed in isopropyl alcohol for 1 minute and wiped to remove heavy black particles. In a class 1000 clean room, each side of the graphite backing plate was sprayed with deionized water at a pressure of 40-50 psi for 5 minutes. The graphite backing plate was then wiped with high-purity deionized water and isopropyl alcohol until no black stains were visible on the wipes. Next, each side of the graphite backing plate was again sprayed with deionized water at a pressure of 40-50 psi for 1 minute. The graphite backing plate was then inserted into a flushing fixture as depicted in FIGS. 1 and 6 (the adapter ring 84 was not used with the graphite backing plate). Nitrogen and high-purity deionized water were flushed at a pressure of 40-50 psi for 15 minutes. Next, the graphite backing plate was immersed in an ultrasonic cleaning tank at a liquid temperature of 40-50° C. at an ultrasonic power of 10-20 W/in² for about 8 minutes on each surface. The surfaces of the graphite backing plate were then wiped with isopropyl alcohol and high-purity deionized water until no black stains were visible on the wipes. Each side of the graphite backing plate was again sprayed with deionized water at a pressure of 40-50 psi for 1 minute. The graphite backing plate was then dried with nitrogen. Next, the graphite backing plate was heated in an oven at a temperature of 120° C. for 3 hours. The graphite backing plate was removed from the oven and allowed to cool down to ambient temperature. Five surface particle counts were taken using a laser particle counter at multiple locations outside of a clean room. Each particle count reading was 0.0 counts/in² for particles of a size of at least 0.3 μm.

Example 6

In this example, an as-received graphite backing plate of Example 4 that had been subjected to ultrasonic cleaning was cleaned according to an exemplary embodiment of the cleaning method described in Example 5. Following the cleaning, five surface particle counts were taken using a laser particle counter at multiple locations outside of a clean room. Each particle count reading was 0.0 counts/in² for particles of a size of at least 0.3 μm.

Example 7

The graphite backing plate of Example 5 was analyzed using a liquid particle counter. The test results are shown in Table 3.

TABLE 3

| | Concentration of Particles/cm² | | | |
|---|---|---|---|---|
| Particle Size | As-Received (without ultrasonic cleaning) | Post 1 hr Ultrasonic Cleaning | Post 2 hr Ultrasonic Cleaning | Post 3 hr Ultrasonic Cleaning |
| ≧0.2 μm | 2,700,000 | 1,900,000 | 1,300,000 | 420,000 |
| ≧0.3 μm | 1,100,000 | 780,000 | 480,000 | 170,000 |
| ≧0.5 μm | 190,000 | 120,000 | 72,000 | 24,000 |
| ≧1.0 μm | 19,000 | 12,000 | 8,200 | 2,200 |
| ≧2.0 μm | 1,100 | 440 | 480 | <100 |

As shown in Table 3, the embodiment of the enhanced cleaning method reduced the number of particles of a size of at least 0.2 μm to low values for the initial liquid particle counter values and after 3 hours of ultrasonic cleaning.

Example 8

The graphite backing plate of Example 6 was analyzed using a liquid particle counter. The test results are shown in Table 4.

TABLE 4

| | Concentration of Particles/cm² | | | |
|---|---|---|---|---|
| Particle Size | As-Received (with ultrasonic cleaning) | Post 1 hr Ultrasonic Cleaning | Post 2 hr Ultrasonic Cleaning | Post 3 hr Ultrasonic Cleaning |
| ≧0.2 μm | 1,000,000 | 740,000 | 590,000 | 410,000 |
| ≧0.3 μm | 420,000 | 280,000 | 250,000 | 160,000 |
| ≧0.5 μm | 60,000 | 35,000 | 33,000 | 17,000 |
| ≧1.0 μm | 4,100 | 2,800 | 2,500 | 1,300 |
| ≧2.0 μm | 430 | 190 | <100 | <100 |

As shown in Table 4, the embodiment of the enhanced cleaning method reduced the number of particles of a size of at least 0.2 µm to lower values than shown in Table 3.

The liquid particle count results for particles of a size of at least 0.2 µm for Examples 1, 2, 7 and 8 are summarized in Table 5.

TABLE 5

| | Concentration of Particles ≧0.2 µm/cm² | | | |
|---|---|---|---|---|
| Example | As-Received | Post 1 hr Ultrasonic Cleaning | Post 2 hr Ultrasonic Cleaning | Post 3 hr Ultrasonic Cleaning |
| 1 - without ultrasonic cleaning | 330,000,000 | 17,000,000 | 9,700,000 | 6,900,000 |
| 2 - with ultrasonic cleaning | 23,000,000 | 12,000,000 | 3,700,000 | 2,100,000 |
| 7 - without ultrasonic cleaning, with enhanced cleaning | 2,700,000 | 1,900,000 | 1,300,000 | 420,000 |
| 8 - with ultrasonic cleaning + enhanced cleaning | 1,000,000 | 740,000 | 590,000 | 410,000 |

Backing plates (e.g., graphite backing plates) and electrode assemblies (e.g., including a graphite backing plate and a silicon electrode secured to the backing plate) cleaned by embodiments of the cleaning methods described herein can be installed in plasma processing chambers and used in plasma processing of semiconductor substrates to significantly reduce the number of particle adders, preferably to on such substrates as compared to backing plates or electrode assemblies that have not be subjected to the cleaning. Embodiments of the cleaning methods can achieve consistently low chamber particle counts and substantially no killer defects. For example, embodiments of the cleaning methods can achieve particle adder counts of less than 20, such as less than 10, or less than 5, for particle adders sized from about 0.2 µm to about 1 µm, area adders counts of particles sized larger than about 0.2 µm of substantially zero.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. A flushing fixture adapted for cleaning a backing plate, or a showerhead electrode assembly including the backing plate and an electrode plate, for a plasma processing chamber, the flushing fixture comprising:
a base plate comprising a recessed inner portion including an upper surface, an outer portion, a lower surface, a plurality of liquid passages extending between the upper surface and the lower surface, the upper surface configured to support the backing plate or the showerhead electrode assembly; and
a cover plate configured to cover the base plate and enclose the backing plate or showerhead electrode assembly when the backing plate or showerhead electrode assembly is supported on the upper surface of the base plate, the cover plate including at least one liquid passage through which a flushing liquid is introduced into an interior of the flushing fixture defined by the base plate and cover plate, the flushing liquid passes through gas passages in the backing plate, or through gas passages in the backing plate and electrode plate of the showerhead electrode assembly, and exits the flushing fixture through the liquid passages in the base plate.

2. The flushing fixture of claim 1, wherein the base plate comprises a plurality of circumferentially spaced alignment holes provided in the outer portion, and the cover plate includes a plurality of alignment pins each of which is sized to be received in an alignment hole of the base plate when the cover plate is positioned to cover the base plate.

3. The flushing fixture of claim 1, further comprising: (a) an adapter ring configured to be positioned between the cover plate and base plate and to contact the cover plate and a surface of the backing plate to prevent the surface of the backing plate from contacting the cover plate and/or (b) an O-ring adapted to provide a liquid seal between the cover plate and the backing plate or the showerhead electrode assembly when supported on the upper surface of the base plate.

4. The flushing fixture of claim 2, wherein the alignment pins are comprised of polytetrafluoroethylene.

5. The flushing fixture of claim 1, wherein the cover plate is circular and comprises a plurality of cut-outs formed in an outer portion thereof, each of the cut-outs configured to receive a fastener of a latch supported on the base plate to secure the cover plate to the base plate.

6. The flushing fixture of claim 1, wherein an outer portion of the cover plate includes a groove and an O-ring in the groove which provides a liquid seal between the cover plate and the backing plate.

7. The flushing fixture of claim 1, wherein the base plate and the cover plate are circular and made of a polymeric material.

8. The flushing fixture of claim 7, wherein the polymeric material is polyetherimide.

9. The flushing fixture of claim 1, wherein the upper surface of the base plate comprises a first annular projection, a second annular projection located radially outward from the first annular projection, and a plurality of circularly-spaced liquid passages located between the first annular projection and the second annular projection.

10. The flushing fixture of claim 9, wherein the upper surface of the base plate further comprises a plurality of circularly-spaced liquid passages located between the second annular projection and the outer portion of the base plate.

11. The flushing fixture of claim 1, wherein the outer portion of the base plate comprises a plurality of circularly-spaced latches.

12. The flushing fixture of claim 11, wherein the latches are recessed and include a fastener.

13. The flushing fixture of claim 1, wherein the cover plate comprises a recessed inner portion adapted to overlie the inner portion of the base plate and an outer portion adapted to overlie the outer portion of the base plate.

14. The flushing fixture of claim 13, wherein the inner portion of the cover plate comprises at least one liquid passage through which a flushing liquid is introduced.

15. The flushing fixture of claim 1, wherein the flushing fixture comprises an enclosure on a top surface of the cover plate, the enclosure including a single fluid passage adapted to supply flushing liquid to liquid passages in the top surface of the cover plate defining a plenum provided on a top surface of the cover plate.

16. The flushing fixture of claim 15, wherein the enclosure comprises a fluid passage for connection to a liquid supply line.

17. The flushing fixture of claim 1, wherein the base plate includes handles provided on the outer portion.

18. The flushing fixture of claim 1, wherein an adapter ring is adapted to overly the backing plate, and an O-ring on the cover plate contacts the adapter ring.

* * * * *